United States Patent  
Bohnert

(10) Patent No.: US 7,911,196 B2  
(45) Date of Patent: Mar. 22, 2011

(54) OPTICAL VOLTAGE SENSOR

(75) Inventor: Klaus Bohnert, Oberrohrdorf (CH)

(73) Assignee: ABB Research Ltd, Zurich (CH)

(*) Notice: Subject to any disclaimer, the term of this patent is extended or adjusted under 35 U.S.C. 154(b) by 26 days.

(21) Appl. No.: 12/488,746

(22) Filed: Jun. 22, 2009

(65) Prior Publication Data  
US 2009/0289617 A1 Nov. 26, 2009

Related U.S. Application Data

(63) Continuation of application No. PCT/CH2006/000734, filed on Dec. 22, 2006.

(51) Int. Cl.  
*G01R 31/00* (2006.01)  
*G01R 15/24* (2006.01)

(52) U.S. Cl. .......................................................... 324/96

(58) Field of Classification Search .................. None  
See application file for complete search history.

(56) References Cited

U.S. PATENT DOCUMENTS

| 4,253,061 | A | * | 2/1981 | Ono et al. ........................ 324/96 |
| 4,269,483 | A | | 5/1981 | Feldtkeller |
| 4,564,289 | A | | 1/1986 | Spillman |
| 4,939,447 | A | | 7/1990 | Bohnert et al. |
| 5,715,058 | A | * | 2/1998 | Bohnert et al. ................. 356/365 |
| 6,122,415 | A | | 9/2000 | Blake |
| 6,636,321 | B2 | * | 10/2003 | Bohnert ........................ 356/483 |
| 7,006,287 | B2 | * | 2/2006 | Chen et al. .................... 359/495 |
| 2002/0006244 | A1 | | 1/2002 | Bohnert |

FOREIGN PATENT DOCUMENTS

| EP | 0 316 619 A1 | 5/1989 |
| EP | 0 316 635 A1 | 5/1989 |
| EP | 0 682 261 A2 | 11/1995 |
| EP | 1 154 278 A2 | 11/2001 |

OTHER PUBLICATIONS

International Search Report (PCT/ISA/210) for PCT/CH2006/000734 dated Aug. 29, 2007.  
Written Opinion (PCT/ISA/237) for PCT/CH2006/000734 dated Aug. 29, 2007.  
K. Bohnert et al., "Temperature and Vibration Insensitive Fiber-Optic Current Sensor", Journal of Lightwave Technology, Feb. 2002, pp. 267-276, vol. 20, No. 2.

(Continued)

*Primary Examiner* — Paresh Patel  
(74) *Attorney, Agent, or Firm* — Buchanan Ingersoll & Rooney PC

(57) ABSTRACT

A voltage sensor includes two optical sensing fibers and a control unit. The sensing fibers carry a first mode of light and a second mode of light, which are orthogonally polarized, with a birefringence between the two modes depending on the electric voltage to be measured. The control unit is configured to generate light for the two modes in the sensing element and to measure the phase delay suffered between the two modes. A 45° Faraday rotator is arranged between the control unit and the sensing fibers. The Faraday rotator allows the behavior and functionality of the sensing fibers and their associated components to be converted to those of a magneto-optical current sensors with polarization-rotated reflection, which in turn allows use of advanced measuring techniques developed for optical gyroscopes and current sensors.

20 Claims, 5 Drawing Sheets

OTHER PUBLICATIONS

K. Bohnert et al., "Coherence-Tuned Interrogation of a Remote Elliptical-Core, Dual-Mode Fiber Strain Sensor", Journal of Lightwave Technology, Jan. 1995, pp. 94-103, vol. 13, No. 1.

K. Bohnert et al., "Fiber-Optic Sensing of Voltages by Line Integration of the Electric Field", Optics Letters, Mar. 1, 1989, pp. 290-292, vol. 14, No. 5.

K. Bohnert et al., "Fiber-Optic DC Current Sensor for the Electro-Winning Industry", 17th Int. Conference on Optical Fibre Sensors, Bruges, Belgium, May 23-27, 2005, Proc. of SPIE, pp. 120-213, vol. 5855.

H. Lefevre, "The Fiber-Optic Gyroscope", Chapter 2—Principle of the Fiber-Optic Gyroscope, pp. 5-26, Chapter 8—Scale Factor Accuracy, pp. 107-133, and Chapter 10—Alternative Approaches for the I-FOG, pp. 147-157, 1993, Artech House, Boston, MA, USA.

Y. Fujii, "High-Isolation Polarization-Independent Quasi-Optical Circulator", Journal of Lightwave Technology, Sep. 1992, pp. 1226-1229, vol. 10, No. 9.

A. Ortigosa-Blanch et al., "Highly Birefringent Photonic Crystal Fibers", Optics Letters, Sep. 15, 2000, pp. 1325-1327, vol. 25, No. 18.

J. Noda et al., "Polarization-Maintaining Fibers and Their Applications", Journal of Lightwave Technology, Aug. 1986, pp. 1071-1089, vol. LT-4, No. 8.

* cited by examiner

OPTICAL VOLTAGE SENSOR

RELATED APPLICATION

This application claims priority as a continuation application under 35 U.S.C. §120 to PCT/CH2006/00734 filed as an International Application on Dec. 22, 2006 and designating the U.S., the entire content of which is hereby incorporated by reference in its entirety.

FIELD

The present disclosure relates to an optical voltage sensor having at least one elongate optical sensing element, such as an optical fiber, for example, and a control unit. The sensing element can be configured to carry at least a first mode and a second mode of light, which are orthogonally polarized. The sensing element can be configured so that the birefringence between the two modes is dependent on the electric voltage to be measured. The control unit can be configured to generate light for the two modes in the sensing element and to measure the phase delay between the two modes.

BACKGROUND INFORMATION

The present disclosure identifies particular references by numerical designation. The references are specifically identified herein following the detailed description of exemplary embodiments. It has been known to measure voltages using optical means.

Some known optical voltage measurement techniques, such as those described in Refs. 1-3 identified below, rely on the piezoelectric effect. In these devices, a field-induced mechanical change in a piezoelectric material leads to stress in an optical sensing element (such as a fiber) that is mechanically coupled to the piezoelectric material. The stress, in turn, leads to a voltage-induced change of birefringence in the sensing element, which can be detected optically.

Other known optical voltage measurement techniques, such as that described in Ref. 10 identified below, rely on the electro-optic effect, in which an electric field changes the refractive index or birefringence of a material directly, e.g., through the linear Pockels effect.

In both techniques, a measurement of the phase delay (or a change thereof) between two orthogonally polarized light waves allows measurement of the electric field strength, or, more accurately, the integral of the same along the path of the light.

It has also been known to measure current by means of similar techniques, see, e.g., Refs. 5-7 identified below, in which a magnetic-field induced phase shift between left and right circularly polarized light waves in a fiber is measured by means of a suitable control unit.

SUMMARY

According to an exemplary embodiment, an optical voltage sensor is provided. The exemplary optical voltage sensor comprises at least one elongate optical sensing element configured to carry at least a first mode of light and a second mode of light. The modes have substantially orthogonal polarization with respect to each other, and a birefringence between the modes is dependent on an electric voltage to be measured. The exemplary optical voltage sensor also comprises a control unit configured to generate light for said two modes in said sensing element and to measure a phase delay suffered by said two modes due to said birefringence. In addition, the exemplary optical voltage sensor comprises at least one Faraday rotator arranged between said control unit and said sensing element, said at least one Faraday rotator being configured to rotate light by 45° for each pass therethrough.

BRIEF DESCRIPTION OF THE DRAWINGS

Further embodiments, advantages and refinements of the present disclosure are explained in more detail below with reference to exemplary embodiments which are illustrated in the drawings, in which like reference symbols are used to denote like elements, and in which.

DETAILED DESCRIPTION

Figure 1:
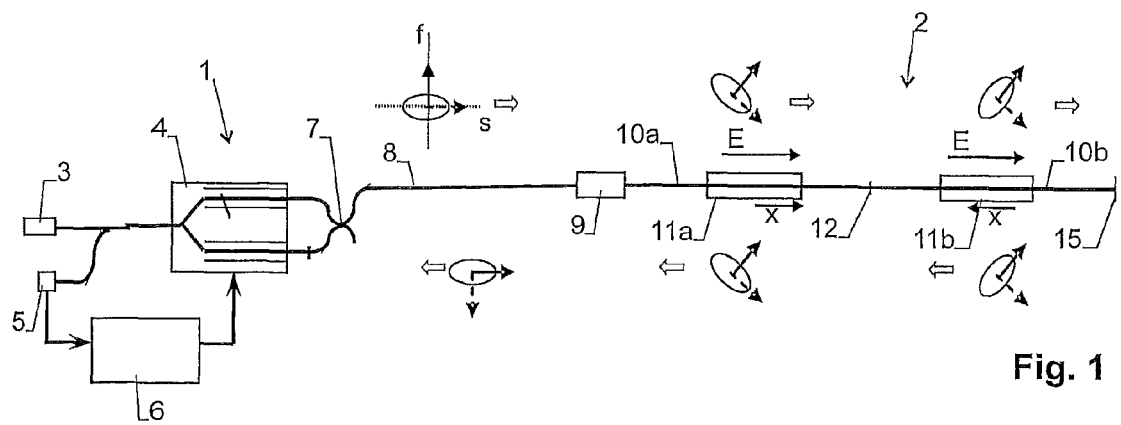
FIG. 1 shows an exemplary first embodiment of a piezoelectric sensor.

Exemplary embodiments of the present disclosure provide a voltage sensor that is configured to measure high voltages in the order of 10 kV or more, and that allows an expedient, accurate and standardized measurement.

Exemplary embodiments of the present disclosure are based on the realization that the addition of a Faraday rotator between the control unit and the sensing element allows the functionality of the electro-optic measuring element and its associated components to be converted to the functionality of a conventional magneto-optical current sensor, which in turn allows the use of advanced control units and measuring techniques developed for optical current sensors.

In particular, magneto-optical sensors, such as those disclosed in Refs. 5-7 identified below, employ control units that generate a first pair of linearly polarized light waves with orthogonal polarizations and send the first pair of linearly polarized light waves to the sensing equipment. The sensing equipment, in turn, returns the light waves as a second pair of linearly polarized light waves, again with orthogonal but swapped polarization directions, and the phase shift between the light waves of the second pair is a function of the current to be measured. Similarly, the control unit according to exemplary embodiments of the present disclosure can generate a first pair of linearly polarized light waves and send the first pair of linearly polarized light waves to the sensing equipment, which (with the help of the Faraday rotator) returns the light waves as a second pair of linearly polarized light waves, with both light waves being orthogonally polarized and the phase shift between the light waves of the second pair being a function of the voltage or electric field to be measured.

According to an exemplary embodiment, the voltage sensor can advantageously comprise at least a first sensing element and a second sensing element arranged in series. The sensing elements can coupled to each other in such a manner that light traveling under the first mode of propagation in the first sensing element is coupled into the second mode of the second sensing element, and vice versa. As described in more detail below, this exemplary configuration allows a series of undesired effects to be compensated and the roundtrip path imbalance of the waves to near zero to be reduced, which thereby allows interference-based measurements even when using a low coherence light source.

A low coherence light source, i.e. a light source having a coherence length in the sub-millimeter range (preferably <0.1 mm), is advantageous because light waves generated by polarization cross coupling, e.g. at the fiber splices, interfere incoherently and thus do not deteriorate the sensor performance.

According to an exemplary embodiment, the voltage sensor is advantageously based on piezoelectric or electro-optic effects, see Refs. 1-3 identified below. According to an exemplary embodiment, a piezoelectric sensor can comprise a piezoelectric element with a sensing element mechanically mounted thereto such that a change of the voltage generates a stress-induced change of birefringence. The sensing element (s) of such an electro-optic sensor can be made of an electro-optic material whose birefringence changes linearly in the presence of an electric field, such as a material showing a sufficiently strong Pockels effect.

The term "sensing element" as employed herein can designate a waveguide, in particular an optical fiber, advantageously having a cross section comparable to the lateral extension of the light field. According to an exemplary embodiment, the waveguide can be polarization maintaining and support a single spatial mode. The mode can be excited with two orthogonal directions of polarization. The term "sensing element" can also designate an element that has a cross section larger than the lateral extension of the optical light field, in which case the (collimated) light beam can propagate substantially freely, i.e. unguided, through the element.

The term "mode" as employed herein designates a waveguide mode if the sensing element is used as a waveguide. The term "mode" as employed herein designates a linearly polarizated light beam that propagates through the sensing element unguided substantially without changing its state of polarization if the sensing element is not used as a wave guide.

Advantages of exemplary embodiments of the present disclosure will now be described in more detail below with reference to the drawings.

Piezo-Electric Voltage Sensors:

FIG. 1 shows an exemplary embodiment of a fiber-optic voltage sensor having a control unit 1 and two sensing elements 2 using a piezo-electrically induced birefringence change.

The control unit 1 can comprise a light source 3, a phase modulator 4 for a non-reciprocal phase modulation, a light detector 5, a signal processor 6, and a polarization maintaining fiber coupler 7. The control unit 1 and the sensing elements 2 can form a polarization-rotated reflection interferometer and use an interrogation technique as known from fiber gyroscopes; for details, see Refs. 4 and 5.

As illustrated in the exemplary configuration of FIG. 1, two orthogonal linearly polarized light waves (indicated by solid and dashed arrows) exit from the control unit 1 and travel through a polarization maintaining (pm) feed fiber 8 (e.g. an elliptical-core fiber) to a Faraday rotator 9 with a rotation angle of 45° per each pass therethrough (or, equivalently, a rotation angle of 45°+k·90° with k being any integer number). In other words, each light wave is rotated by approximately 45° each time it passes through the Faraday rotator 9. The rotation is non-reciprocal. That is, the rotation as seen from an observer looking towards the light beam is, for example, clockwise if the beam propagates from left to right, but counter-clockwise if the beam propagates from right to left. The total rotation is thus approximately 90° (or 90°+k·180° with k being an integer number). The light waves exiting from the Faraday rotator 9 can be coupled into a first pm sensing fiber 10*a*. The fast and slow axes of this sensing fiber 10*a* can oriented at approximately 45° with regard to the axes of the pm feed fiber 8 left of the rotator 9. As a result, the polarization directions after the rotation can again coincide with the birefringent fiber axes. A second identical pm sensing fiber 10*b* can be spliced at a splice 12 with its axes rotated by approximately 90° with respect to the first sensing fiber 10*a*. The waves polarized parallel to slow axis in the first fiber 10*a* can then be polarized along the fast axis in the second fiber 10*b*, and vice versa. The waves can be reflected at the end of second fiber 10*b* by a mirror 15, upon which the waves can then retrace their paths from the mirror 15. A non-reciprocal Faraday rotator 9 can introduce another 45° rotation that adds to the first rotation. The total rotation on the way forward and backward is thus approximately 90°, i.e. the light waves again return with swapped polarizations to the control unit 1, as in the current sensor of Ref. 5 identified below. This exemplary configuration is therefore advantageous because it keeps the total roundtrip path imbalance of the waves at or near zero and thus within the coherence length of the low coherent light source 3. Furthermore temperature and vibration induced optical phase changes in the fiber between the modulator 4 and the Faraday rotator 9 largely cancel each other. Note that on a one way trip through the birefringent fibers 8, 10*a*, 10*b*, the orthogonal waves accumulate a path difference due to their different group velocities. According to an exemplary embodiment, the path imbalance is 0.5 to 1 mm per meter of fiber at a wavelength of 820 nm.

According to the exemplary embodiment illustrated in FIG. 1, the two sensing fibers 10*a*, 10*b* to the right of Faraday rotator 9 can function as strain sensors and can be used to measure the periodic piezo-electric deformation of piezoelectric quartz transducer elements 11*a*, 11*b* under the influence of an alternating electric field (see below). The induced fiber strain can cause a differential phase shift between the two orthogonal waves.

The two transducer elements 11*a*, 11*b* can be arranged anti-parallel to each other, i.e., their polar axes x (2-fold crystal axis of quartz) are anti-parallel as shown in the example of FIG. 1. The phase shifts in the sensing fibers can then be of the same sign if the electric field directions E are the same (as indicated).

According to the exemplary embodiment illustrated in FIG. 1, the advantages of using a first and a second sensing fiber 10*a*, 10*b* and the transducer elements 11*a*, 11*b* arranged opposite to each other are as follows:

The second pm sensing fiber 10*b* can balance the optical path imbalance between the two orthogonal waves introduced in the first sensing fiber 10*a*. Again, this is necessary to keep the total path imbalance within the coherence length of a low coherent light source.

The second sensing fiber 10*b* can also compensate for thermal phase shifts in the first fiber 10*a* provided that the temperature of the two fibers is about the same. Compensation of large thermal phase shifts is necessary, because more sophisticated signal processing might otherwise be needed. According to an exemplary embodiment, the total phase changes could be designated to remain within an interval of ±π.

The second fiber 10b allows doubling of the sensitivity of the voltage sensor and effective cancellation of vibration-induced effects (see below).

According to an exemplary embodiment, the polarization-maintaining fibers can be elliptical-core fibers, so-called Panda or bowtie fibers, fibers with inner elliptical cladding, micro-structured fibers, or other types of pm fiber such as those disclosed in Refs. 8 and 9.

It should be noted that, with the detection technique according to the exemplary embodiment described above, the effective sensitivity of the two pm sensing fibers 10a, 10b to alternating strain can vary as a function of the time delay between the forward and backward propagating waves at the location of the strain-applying transducer elements 11a, 11b, and thus as a function of the length of the fibers. The strain-induced phase shift can be at its maximum if the time delay is negligible as compared to the period of the alternating strain. The strain-induced phase shift can become zero if the delay corresponds to half a period of the strain. Furthermore, the effective sensitivities of the two sensing fibers 10a, 10b can differ from one another if the delay is not negligible. However, for the example considered below, in which a strain periodicity of 50 or 60 Hz and fiber lengths up to some meters is contemplated, the time delay is negligible and the delay effects can be disregarded.

Figure 2:
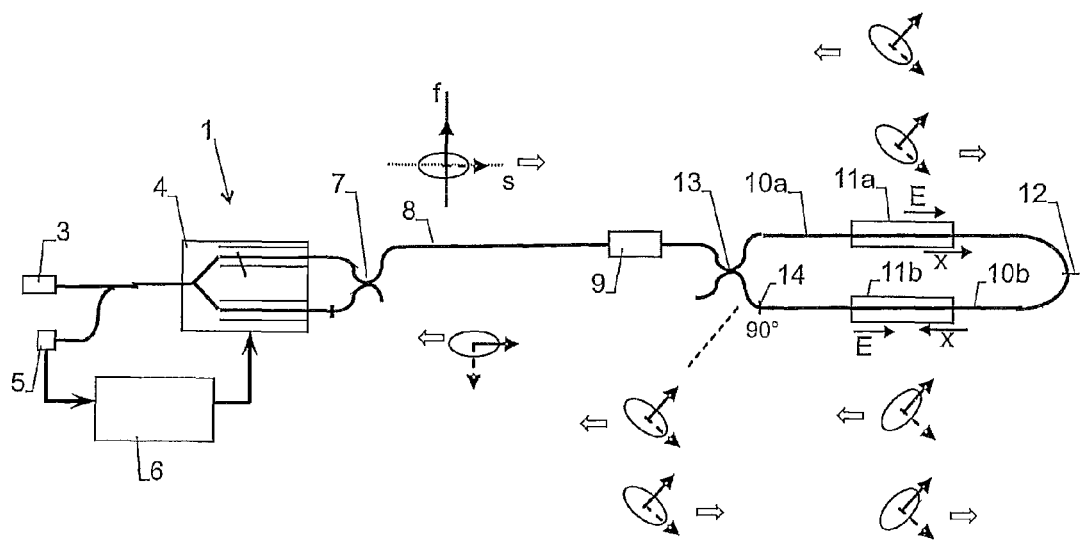
FIG. 2 shows an exemplary second embodiment of a piezoelectric sensor.

FIG. 2 shows an exemplary modification of the configuration illustrated in FIG. 1. According to the exemplary embodiment illustrated in FIG. 2, a pm fiber coupler 13 and the two pm sensing fibers 10a, 10b can form a loop mirror. The coupler end at the Faraday rotator 9 can be oriented like the first sensing fiber 10a section in FIG. 1. The loop can contain two 90°-splices 12, 14. The splices can divide the loop in two halves with identical lengths. An extra reflector is not needed. Two pairs of orthogonal polarizations with orientations as indicated in the example of FIG. 2 counter-propagate in the loop. The functions of the two loop halves are the same as the ones of the two sensing fibers 10a, 10b in FIG. 1. The phase shifts in the fibers 10a, 10b add if the crystallographic x-directions and the field directions E are as indicated in FIG. 2. A potential advantage of this exemplary configuration is that for a symmetric arrangement of the transducer elements 11a, 11b, the effective sensitivities can always be the same independent of the time delay (while the sensitivities again decrease with increasing delay).

The phase modulator 4 in the exemplary configurations illustrated in FIGS. 1 and 2 is an integrated-optics lithium modulator, see, e.g., Ref. 4 identified below. The modulator can also function as a polarizer. Another alternative is a piezo-electric modulator as illustrated in Ref. 5 identified below.

Figure 3:
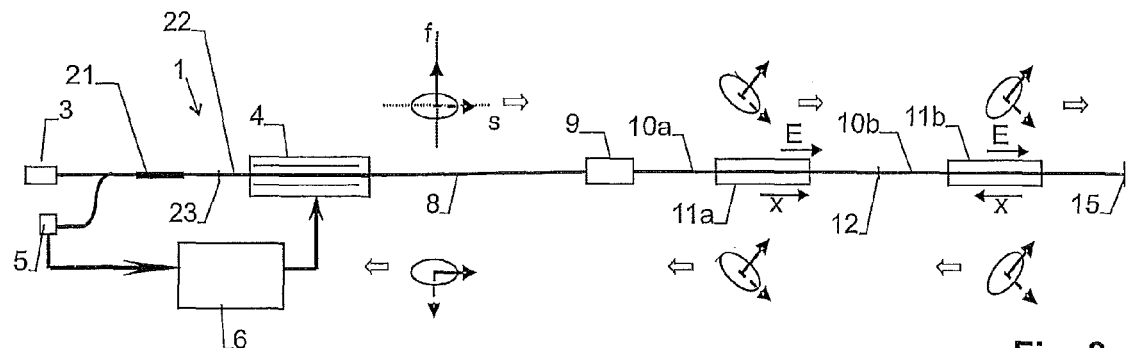
FIG. 3 shows an exemplary third embodiment of a piezoelectric sensor.

FIG. 3 shows the same exemplary configuration as in FIG. 1, except for a different type of integrated-optics phase modulator 4. According to the exemplary configuration illustrated in FIG. 3, the modulator 4 is a birefringence modulator which can directly modulate the phase of orthogonal light waves. The pm coupler 7 of FIG. 2 is then no longer needed. Depolarized light from light source 3 (depolarizer not shown) can be polarized in a fiber polarizer 21 and subsequently coupled into an entrance pm fiber lead 22 of the modulator at splice 23, for example. The polarization direction is at approximately 45° to the axes of the pm fiber lead (45° splice). As a result, two orthogonal waves of equal amplitude are excited. The fast and slow axes of both pm fiber leads 22, 8 of modulator 4 can be parallel to the electro-optic axes of the modulator.

Alternatively, a piezoelectric modulator as illustrated in Ref. 6 identified below may be used as a birefringence modulator.

Figure 4:
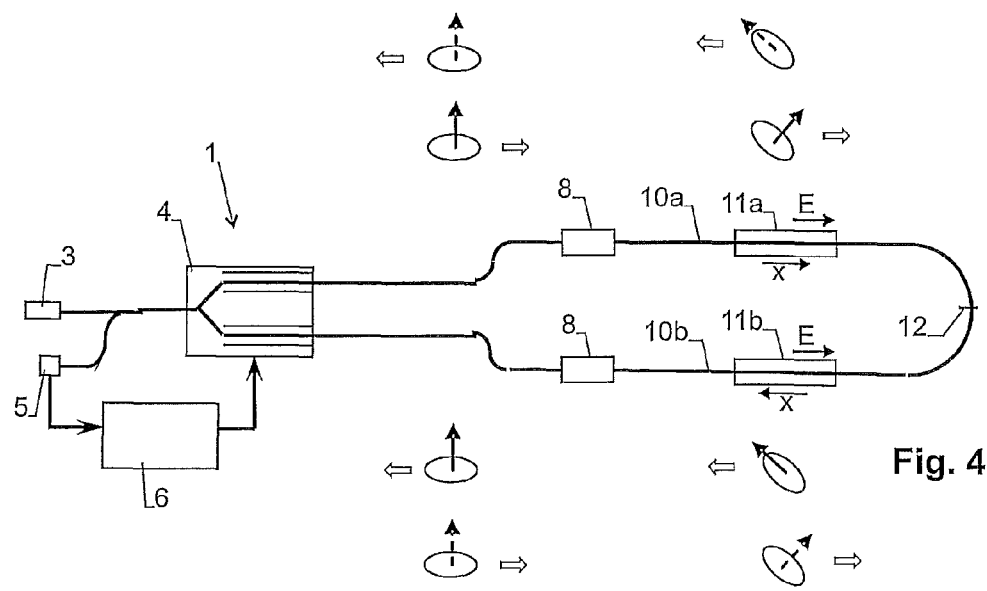
FIG. 4 shows an exemplary fourth embodiment of a piezoelectric sensor.

FIG. 4 shows an exemplary implementation of the disclosure based on a Sagnac type interferometer using two Faraday rotators 8. According to the exemplary embodiment illustrated in FIG. 4, there are two counter-propagating waves having parallel polarizations between the modulator 4 and the rotators 8, and orthogonal polarizations in the first and second pm sensing fibers 10a, 10b with the transducer elements 11a, 11b. The orientation of the fiber cores at the rotators 8 is as described above. The sensing fibers can both be rotated in the same direction, i.e. both clockwise or both counter-clockwise, with regard to the planes of polarization of the forward traveling waves between modulator 4 and the rotators 8. The phase shifts in the fibers 10a, 10b add if the crystallographic x-directions and the field directions E are as indicated in FIG. 4.

Figure 5:
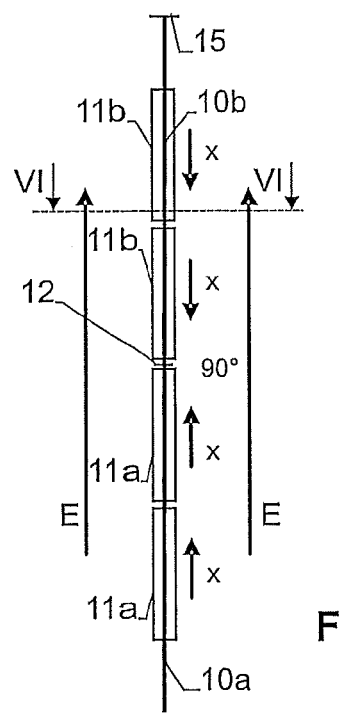
FIG. 5 shows an exemplary first arrangement of the piezoelectric elements.
Figure 6:
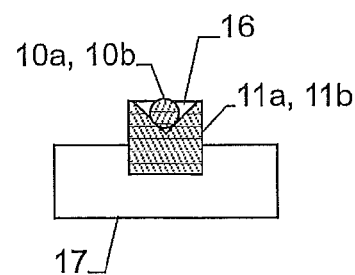
FIG. 6 shows a sectional view along line VI-VI of FIG. 5

FIGS. 5 and 6 show an exemplary arrangement of a piezo-optic voltage sensor of the type of FIGS. 1-4 for a line integration of the electric field according to an exemplary embodiment. Only the field sensing part of the sensor is shown, i.e., the two pm sensing fibers 10a, 10b and the transducer elements 11a, 11b. The transducer elements 11a, 11b can be identical quartz beams (or platelets), for example, according to Ref. 2 identified below. In the exemplary embodiment illustrated in FIGS. 5 and 6, two transducer elements can be assigned to each sensing fiber 10a, 10b. Such transducer elements may be arranged between ground and high-voltage potentials with (equidistant), non-negligible spacing between them or they can form an essentially continuous quartz bridge as shown in the example of FIG. 5. In the latter case, the beams can have a length of, e.g., 200 mm and a cross-section of, e.g., 2×2 mm². The measurement of, e.g., 245 kV in high voltage substations may require 10-12 of such quartzes, for example. The longitudinal axis of the beams and the direction of the fiber can coincide with a crystallographic x-direction (2-fold crystal axis). Quartz is a exemplary material for the piezo-electric transducers due to its superior material properties. Others appropriate materials are given in Refs. 1 and 2 identified below.

The two sensing fibers 10a, 10b can, for example, be attached to the transducer elements 11a, 11b with the 90°-splice 12 at half the distance between ground and high-voltage (Faraday rotator and mirror). The optical phase shifts of the two fiber sections caused by the thermal expansion of the quartzes can then be the same and cancel each other.

The x-directions (or polar directions) of the quartzes of a given sensing fiber can point in the same direction. The x-directions along the second sensing fiber 10b can be in anti-parallel to the x-directions along the first sensing fiber 10a. The sign of the optical phase shifts at increasing or decreasing field strength can then be the same at all transducer elements as required for the line integration of the field: The field-induced piezoelectric strains at the two sensing fibers can have opposite signs due to the anti-parallel crystal directions; the two sensing fibers can therefore react to a given change in strain with opposite sign dues to the 90° splice. As a result, the combined effects can have the same sign. The overall phase shift can be a measure for the line integral of the field and thus the voltage. A further benefit of this exemplary arrangement is that optical phase shifts caused by external common-mode mechanical perturbations such as vibrations cancel each other.

According to an exemplary embodiment, the sensing fibers 10a, 10b can have a coating which transmits, over a wide temperature range, such as −40 to 85° C., for example, the entire piezoelectric strain from the quartzes to the sensing fibers (for example, a thin polyimide coating or coating of diamond like carbon (DLC)). According to an exemplary embodiment, the sensing fibers can be attached to the quartzes with some extensional pre-strain. The pre-strain can be sufficiently large so that sufficient strain is still maintained when the quartzes contract at low temperatures. The sensing fibers may be mounted to the quartz surface or to a groove 16 in the surface with an appropriate bonding material. Alternatively, the fiber can be attached in a through-hole along x.

The series of quartzes can be attached to a common support structure 17 such as a strip of fiber re-enforced epoxy. The strip can be mounted for mechanical protection in a tube, cable or another enclosure.

Figure 7:
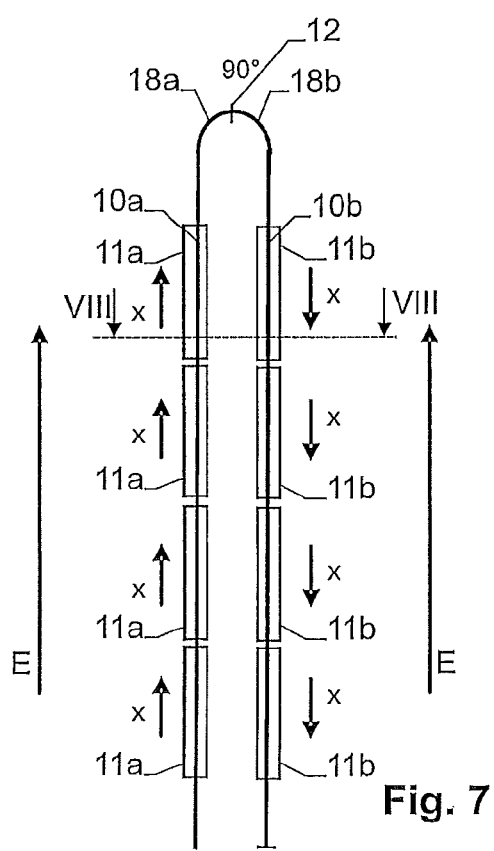
FIG. 7 shows an exemplary second arrangement of the piezoelectric elements.
Figure 8:
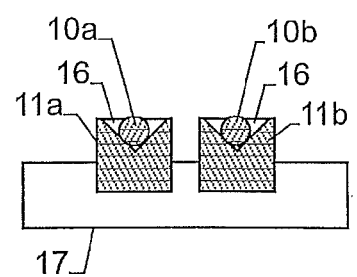
FIG. 8 shows a sectional view along line VIII-VIII of FIG. 5.

FIGS. 7 and 8 show another exemplary arrangement in which the sensing elements 2 or sensing fibers 10a, 10b can be arranged side by side and optically coupled by a 90° splice 12 at neighboring ends 18a, 18b. This exemplary configuration comprises two parallel series of piezoelectric transducer elements 11a, 11b with axis directions x and a fiber arrangement as indicated. The neighboring transducer elements 11a and 11b can be mounted to a common support structure 17 as shown in the example of FIG. 8. Advantages of this exemplary arrangement are as follows: (i) The sensitivity (optical phase shift per voltage change) is doubled as compared to FIG. 5. (ii) Vibration-induced phase changes are cancelled more completely since the two quartz series are very close to each other. (iii) Short wavelength vibrations are still common-mode.

Further Alternatives (not Illustrated):
- Instead of two sensing fibers, the sensor can contain three or more sensing fibers spliced at 90° and having lengths such that the total path imbalance of the orthogonal light waves is again zero. The fibers may be of the same or different type.
- The sensing fibers can be attached to a series of transducer elements (or several series of transducer elements) such that the fibers pass each series several times, thus enhancing the sensitivity of the sensor.
- The quartz beams or platelets can be replaced by quartz cylinders with the sensing fibers attached to the circumferential surface of the cylinders (see Ref. 2 identified below).
- Only one sensing fiber can be attached to the transducer elements (quartzes) while the second section only serves for compensation of the path imbalance.

Figure 9:
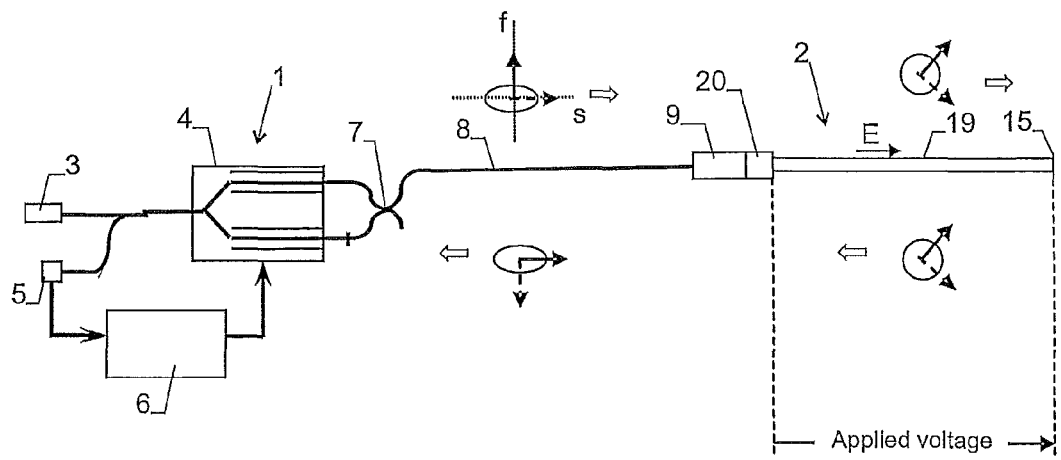
FIG. 9 shows an exemplary first embodiment of a electro-optic sensor.

Electro-Optic Voltage Sensors:

FIG. 9 shows an exemplary electro-optic voltage sensor according to the present disclosure. The first and second sensing fibers 10a, 10b and the piezoelectric transducer elements 11a, 11b of FIG. 1 can be replaced by an electro-optic crystal 19. A collimator 20 between the 45° Faraday rotator 9 and crystal 19 generates a collimated beam which can be launched into crystal 19. The beam double passes crystal 19 and is then coupled back into feed fiber 8. Due to the 45°-rotator 9, the light waves again return with swapped polarizations.

According to an exemplary embodiment, crystal 19 is suitable to line integration of the electric field. Appropriate crystal classes and crystal orientations are listed in Tables 1 and 2 of Ref. 10 identified below. The electro-optic axes of crystal 8 can be aligned at approximately 45° with respect to the birefringent axes of feed fiber 8. The polarization directions of the orthogonal linearly polarized light waves in crystal 8 can then be parallel to the electro-optic axes. On their roundtrip through crystal 19, the waves accumulate an electro-optic phase shift proportional to the applied voltage. The roundtrip phase shift can be twice as large as the single pass shift. Advantageously, the crystal belongs to one of the classes of Table 1 in Ref. 10. These crystals can free of any intrinsic birefringence. An exemplary material is $Bi_4(GeO_4)_3$ (BGO).

Figure 10:
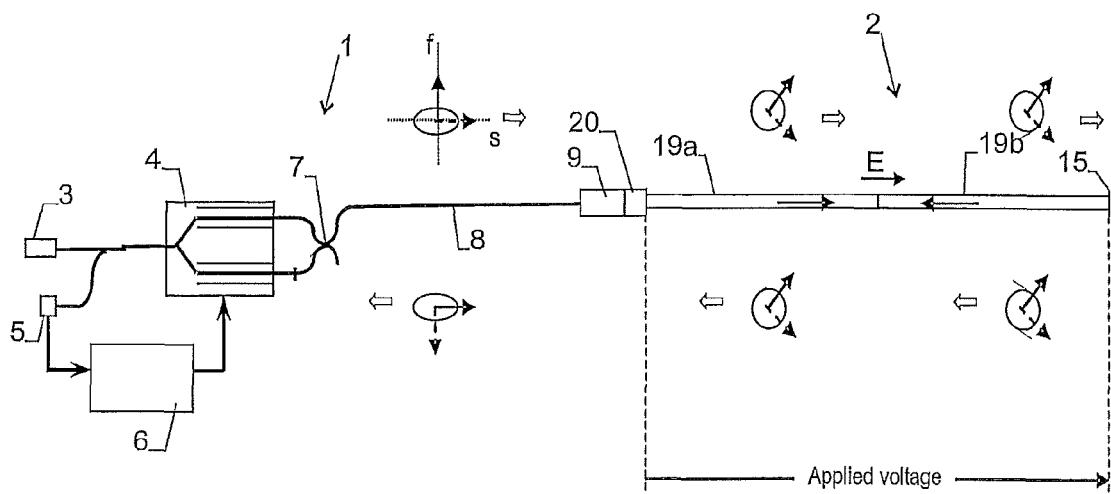
FIG. 10 shows an exemplary second embodiment of an electro-optic sensor.

In case of a birefringent crystal (Table 2), it is advantageous to use a series of two identical crystals 19a, 19b as shown in the example of FIG. 10. The axes of birefringence (which are also the electro-optic axes) of the two crystals 19a, 19b can have a 90°-offset and the longitudinal axes (a 2-fold axis for the materials of Table 2) can be anti-parallel. The phase shifts from the intrinsic birefringence can then cancel each other while the electro-optic phase shifts add.

An electro-optic crystal fiber may be used instead of a bulk electro-optic crystal. The collimator may be omitted in case of a crystalline single-mode fiber.

The electro-optic crystal could also be part of a loop mirror configuration according to the exemplary configuration of FIG. 2 or the exemplary Sagnac configuration illustrated in FIG. 5.

Figure 11:
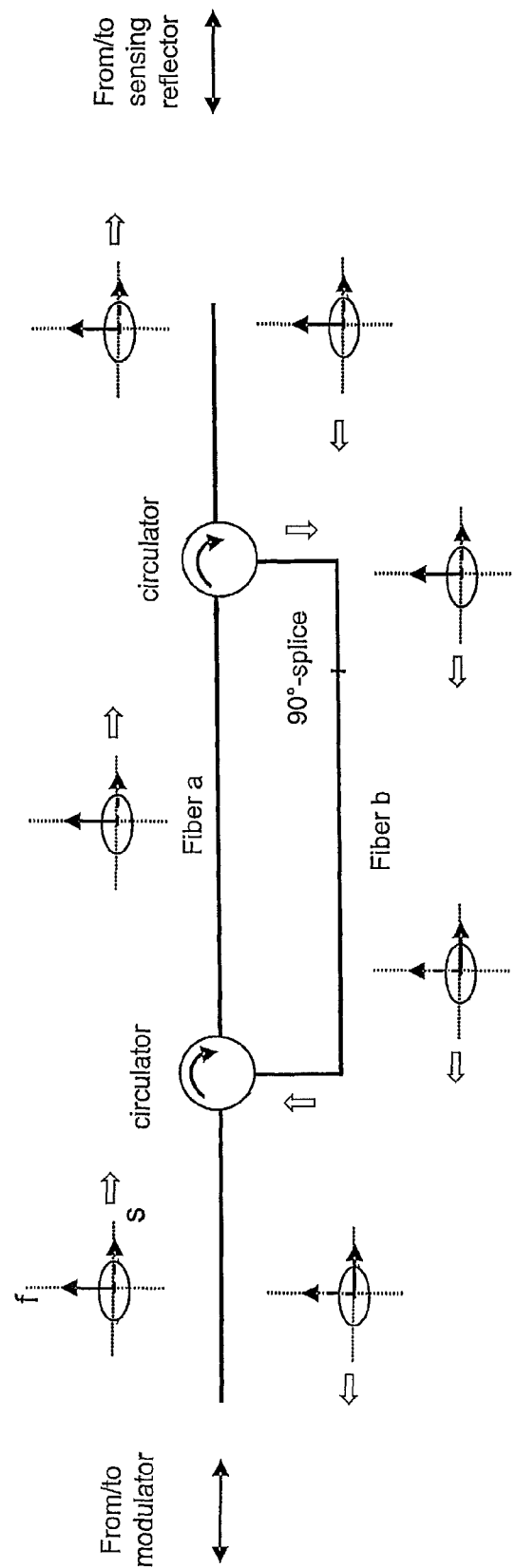
FIG. 11 shows an alternative implementation of the rotator.

Instead of using a 45°-Faraday rotator as shown in the preceding exemplary embodiments, the polarization directions of the returning light waves can be rotated by means of two polarization-insensitive optical circulators [11] as shown in the exemplary configuration of FIG. 11. Fibers a and b are again polarization maintaining. The lengths of the various fiber segments are such that the total path difference of the two orthogonal waves is again zero. Fiber b (or fiber a) may include a 90°-splice as indicated to rotate the polarizations. Alternatively, the fibers may be attached to the circulators with axes orientations such that polarization directions of the returning waves are swapped as desired.

The use of circulators instead of a simple Faraday rotator offers no advantages and is mentioned here only for the sake of completeness. Note that any circulator contains at least one Faraday rotator.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCES

1. EP 316 635, EP 316 619
2. K. Bohnert and J. Nehring, Fiber-optic sensing of voltages by line integration of the electric field, Opt. Lett. 14, 290 (1989).
3. K. Bohnert, G. de Wit, and J. Nehring, Coherence-tuned Interrogation of a remote elliptical-core, dual-mode fiber strain sensor", K. Bohnert, G. de Wit, and J. Nehring, J. of Lightwave Technology 13, 94 (1995).
4. "The fiber-optic gyroscope", Herve Lefevre, Artech House, Boston, London, 1993.
5. EP1 154 278
6. K. Bohnert, P. Gabus, J. Nehring, and H. Brändle, "Temperature and vibration insensitive fiber-optic current sensor", *J. Lightw. Technol.*, vol. 20, no. 2, pp. 267-276, 2002.
7. K. Bohnert, P. Gabus, H. Brändle, Peter Guggenbach, Fiber-optic dc current sensor for the electro-winning industry", in 17th Int. Conference on Optical Fibre Sensors, Bruges, Belgium, May 23-27, 2005, edited by M. Voet, R.

Willsch, W. Ecke, J. Jones, B. Culshaw, Proc. of SPIE Vol. 5855 (SPIE, Bellingham, Wash., 2005) 210-213.
8. J. Noda, K. Okamoto, and Y. Sasaki, "Polarization-maintaining fibers and their applications", J. Lightw. Technol. 4, 1071-1089, 1986.
9. A. Orthigosa-Blanch et al., Highly birefringent photonic crystal fibers, Optics Letters 25, 1325, 2000.
10. EP 682 261
11. Y. Fujii, High-isolation polarization-independent quasi-optical circulator, J. of Lightwave technology 10, 1226 (1992).

LIST OF REFERENCE NUMERALS

1: control unit
2: sensing element
3: light source
4: phase modulator
5: light detector
6: signal processor
7: pm fiber coupler
8: feed fiber
9: Faraday rotator
10a, 10b: sensing fibers
11a, 11b: piezoelectric transducer elements
12: 90° splice
13: pm fiber coupler
14: 90° splice
15: mirror
16: groove
17: support
18: sensing fiber ends
19, 19a, 19b: electro-optic crystals
20: collimator
21: fiber polarizer
22: pm fiber lead
23: splice

What is claimed is:

1. An optical voltage sensor comprising:
at least one elongate optical sensing element configured to carry at least a first mode of light and a second mode of light, said modes having substantially orthogonal polarization with respect to each other, and a birefringence between said modes being dependent on an electric voltage to be measured;
a control unit configured to generate light for said two modes in said sensing element and to measure a phase delay suffered by said two modes due to said birefringence; and
at least one Faraday rotator arranged between said control unit and said sensing element, said at least one Faraday rotator being configured to rotate light by 45° for each pass therethrough.

2. The voltage sensor of claim 1, wherein the control unit comprises a light source, a phase modulator for a non-reciprocal phase modulation, a light detector, a signal processor, and
wherein the at least one Faraday rotator is arranged between said phase modulator and said sensing element.

3. The voltage sensor of claim 1, wherein the modulator is a birefringence modulator configured to directly modulate the phase of orthogonal light waves.

4. The voltage sensor of claim 3, wherein birefringence modulator is an integrated-optics lithium modulator.

5. The voltage sensor of claim 3, comprising at least a first sensing element and a second sensing element, said sensing elements being arranged in series and being coupled to each other such that light traveling under said first mode in said first sensing element is coupled into said second mode in said second sensing element, and vice versa.

6. The voltage sensor of claim 3, further comprising at least one piezoelectric transducer, wherein said sensing element is mounted to said piezoelectric transducer such that a change of said voltage generates a stress-induced change of said birefringence.

7. The voltage sensor of claim 3, wherein said sensing element is comprised of an electro-optic material and is configured to change said birefringence under an electric field.

8. The voltage sensor of claim 3, wherein said sensing element is an optical fiber.

9. The voltage sensor of claim 1, comprising at least a first sensing element and a second sensing element, said sensing elements being arranged in series and being coupled to each other such that light traveling under said first mode in said first sensing element is coupled into said second mode in said second sensing element, and vice versa.

10. The voltage sensor of any of claim 9, comprising at least two piezoelectric transducer elements,
wherein said first sensing element is mounted to at least a first one of said piezoelectric transducer elements and said second sensing element is mounted to at least a second one of said piezoelectric transducer elements, and
wherein said first and second piezoelectric transducer elements are arranged anti-parallel to each other.

11. The voltage sensor of claim 9, wherein the longitudinal axes of said first and said second sensing elements are arranged anti-parallel to each other.

12. The voltage sensor of claim 9, wherein said first sensing element and said second sensing element are arranged side by side and mounted to a common support structure.

13. The voltage sensor of claim 12, wherein said sensing elements are comprised of an electro-optic material and configured to change said birefringence under an electric field.

14. The voltage sensor of claim 1, further comprising at least one piezoelectric transducer, wherein said sensing element is mounted to said piezoelectric transducer such that a change of said voltage generates a stress-induced change of said birefringence.

15. The voltage sensor of claim 14, wherein said sensing element is arranged in a groove or a through-hole of said piezoelectric transducer.

16. The voltage sensor of claim 14, wherein said piezoelectric transducer is comprised of quartz.

17. The voltage sensor of claim 1, wherein said sensing element is comprised of an electro-optic material and is configured to change said birefringence under an electric field.

18. The voltage sensor of claim 1, further comprising a polarization maintaining feed fiber between said control unit and said Faraday rotator.

19. The voltage sensor of claim 1, wherein said sensing element is an optical fiber.

20. The voltage sensor of claim 19, wherein said sensing element is a polarization maintaining fiber.

* * * * *